(12) United States Patent
Bauer

(10) Patent No.: US 6,956,399 B1
(45) Date of Patent: Oct. 18, 2005

(54) HIGH-SPEED LOOKUP TABLE CIRCUITS AND METHODS FOR PROGRAMMABLE LOGIC DEVICES

(75) Inventor: Trevor J. Bauer, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 30 days.

(21) Appl. No.: 10/772,859

(22) Filed: Feb. 5, 2004

(51) Int. Cl.[7] .......................................... H03K 19/177
(52) U.S. Cl. ........................... 326/41; 326/38; 326/105
(58) Field of Search .............................. 326/38–41, 47, 326/101, 113, 104–106

(56) References Cited

U.S. PATENT DOCUMENTS

| | | | |
|---|---|---|---|
| 6,505,337 B1 * | 1/2003 | Wittig et al. .................. | 716/17 |
| 6,621,296 B2 * | 9/2003 | Carberry et al. .............. | 326/40 |
| 6,621,298 B2 * | 9/2003 | Agrawal et al. .............. | 326/50 |

OTHER PUBLICATIONS

U.S. Appl. No. 09/783,821, filed Feb. 14, 2001, Carmichael et al.
U.S. Appl. No. 10/603,734, filed Jun. 21, 2003, Keller et al.
U.S. Appl. No. 10/768, 304, filed Jan. 29, 2004, Keller et al.
Phil Brinkley, Carl Carmichael; XAPP181 (v.1.0); "SEU Mitigation Design Techniques for the XQR4000XL"; Mar. 15, 2000; available from Xilinx, Inc., 2100 Logic Drive, San Jose, CA 95124 or http//www.xilinx.com.; pp. 1-14.

* cited by examiner

*Primary Examiner*—Vibol Tan
(74) *Attorney, Agent, or Firm*—Lois D. Cartier

(57) ABSTRACT

A lookup table (LUT) circuit comprises a multiplexer circuit having two modes. In a first mode, the multiplexer circuit functions as a standard multiplexer. In a second mode, the multiplexer circuit selects two or more stored values, where the two or more stored values have the same logical value. Thus, in the second mode the delay through the multiplexer circuit is reduced. In a PLD embodiment, two select terminals of the multiplexer are coupled to two different signal lines. When both signal lines are used, the multiplexer circuit is placed into the first mode. When only one of the signal lines is used, the multiplexer circuit is placed into the second mode, a value on the unused signal line is ignored, and two stored values are provided to the output terminal. Thus, the multiplexer circuit has a reduced path delay when one of the two signal lines is unused.

61 Claims, 12 Drawing Sheets

HIGH-SPEED LOOKUP TABLE CIRCUITS AND METHODS FOR PROGRAMMABLE LOGIC DEVICES

FIELD OF THE INVENTION

The invention relates to Programmable Logic Devices (PLDs). More particularly, the invention relates to high-speed lookup table circuits and methods for PLDs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, processors, and so forth).

The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Programmable lookup tables are often included in PLDs. A lookup table is a circuit that provides an output value selected from among two or more stored values in response to a combination of input values. One method of implementing a lookup table (LUT) is to store $2^{**}n$ values in memory cells (e.g., configuration memory cells in an FPGA), where n is the number of input signals to the LUT. Each of the n input signals is then utilized to select only half of the remaining stored values. For example, a 4-input LUT can utilize the four input signals to select first eight, then four, then two, and finally one of 16 stored values.

FIG. 1 illustrates a well-known LUT circuit that functions according to this well-known method. A 2-input LUT is shown, as in many of the drawings herein, to clarify the drawings. Many LUTs now included in FPGAs, for example, utilize four input signals. The illustrated examples are easily modified to accommodate four input signals (or other numbers of input signals) by one of skill in the relevant arts.

The LUT circuit of FIG. 1 has two input signals IN1 and IN2, and can provide at the output terminal OUT any of four values stored in memory cells MC-0 through MC-3. (In the present specification, the same reference characters are used to refer to terminals, signal lines, and their corresponding signals.) The LUT circuit includes six inverters 101–106, six N-channel transistors 111–116, and a pullup 121 implemented using a P-channel transistor. N-channel transistors 111–116 implement a well-known 4-to-1 multiplexer circuit.

Inverters 105–106 and pullup 121 implement a well-known output buffer. The output (node M) of the multiplexer circuit drives inverter 105 and is pulled to power high (VDD) by P-channel transistor 121. The output terminal of inverter 105 is coupled to the gate terminal of pullup 121 and also drives inverter 106, which provides the output signal OUT to the output terminal. Pullup 121 serves to pull node M fully to power high VDD when a memory cell storing a high value is selected by transistors 111–116.

The LUT circuit of FIG. 1 functions as shown in the example illustrated in FIG. 2, wherein both input signals IN1 and IN2 are high, memory cells MC-0 through MC-2 store low values, and memory cell MC-3 stores a high value. When input signal IN2 is high, the output of inverter 101 goes low, turning off transistors 112 and 114. The output of inverter 101 also drives inverter 103, so the output of inverter 103 goes high, turning on transistors 111 and 113. Similarly, when input signal IN1 is high, the output of inverter 102 goes low, turning off transistor 116. The output of inverter 102 also drives inverter 104, so the output of inverter 104 goes high, turning on transistor 115. Thus, a path is enabled between memory cell MC-3 and node M, and the high value stored in memory cell MC-3 is provided to node M and hence to output terminal OUT. A heavy line in FIG. 2 shows the signal path now enabled between memory cell MC-3 and output terminal OUT.

Another well-known LUT circuit (not shown) is similar to that of FIG. 1. N-channel transistors 111–116 are replaced by CMOS passgates, which include N-channel and P-channel transistors coupled in parallel. The N-channel transistors are coupled as shown in FIG. 1. Each P-channel transistor is gated by the complementary signal to the signal driving the associated N-channel transistor. In this version of the circuit pullup 121 can be omitted, because the P-channel transistors in the CMOS passgates ensure a fully high value on node M.

A PLD can include hundreds of thousands of LUTs implementing large amounts of user logic. In some designs, several LUTs are preferably included on each path between two clocked elements. Hence, the delay through each LUT can be quite significant in determining the speed at which a user design will operate. Therefore, it is desirable to provide a LUT circuit having a reduced delay when compared to known LUT circuits.

SUMMARY OF THE INVENTION

The invention provides lookup table (LUT) circuits and methods that can be used, for example, in programmable logic devices (PLDs). A LUT according to one embodiment comprises a multiplexer circuit having two modes. In a first mode, the multiplexer circuit functions as a standard multiplexer, e.g., each select input signal is used to select only half of the remaining stored values, until a single stored value is selected as the multiplexer output. In a second mode, the multiplexer circuit selects two or more stored values, where the selected values all have the same logical value. All of the selected values are provided to the multiplexer output terminal. The effective resistance through the multiplexer is reduced. Thus, in the second mode the multiplexer circuit provides a more rapid propagation of the stored values to the output terminal.

In some embodiments, the mode of the multiplexer circuit is controlled by a programmed value stored in a memory cell, e.g., a configuration memory cell in a PLD. In one embodiment, two select terminals of a multiplexer circuit are coupled to two different signal lines. When both signal lines are used in the PLD design, the multiplexer circuit is placed into the first mode, i.e., the multiplexer circuit functions as a standard multiplexer, selecting one output value based on signals provided by the first and second signal lines. When only one of the signal lines is used, the multiplexer circuit is placed into the second mode, in which a value on the unused signal line is ignored, and two identical stored values are provided to the output terminal. Thus, the multiplexer circuit has a reduced path delay when one of the two signal lines is unused.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial for field programmable gate arrays (FPGAs). While the present invention is not so limited, an appreciation of the present invention is presented by way of specific examples, in this instance with a variety of lookup table (LUT) circuits utilizing the configuration memory cells of an FPGA.

Figure 3:
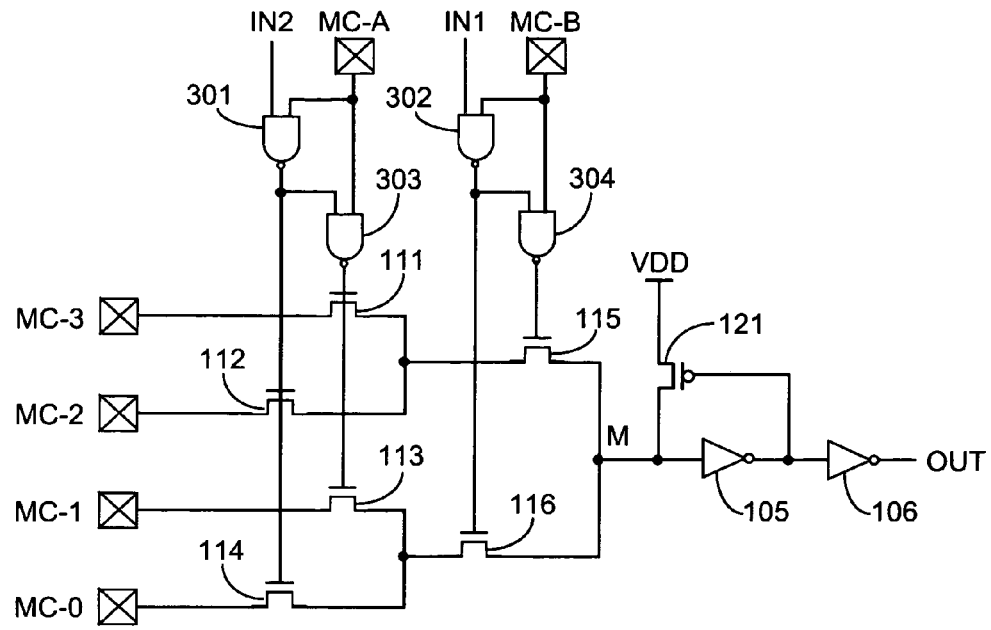
FIG. 3 shows a first 2-input LUT circuit according to an embodiment of the present invention.

FIG. 3 illustrates a LUT circuit for an FPGA. To clarify the drawing, a 2-input LUT is shown, as in many of the drawings herein. However, the principles of the invention can be applied to LUTs having any number of input signals, e.g., four, six, or any other number greater than one. The illustrated examples are easily modified to accommodate other numbers of input signals by one of skill in the relevant arts.

Figure 1:
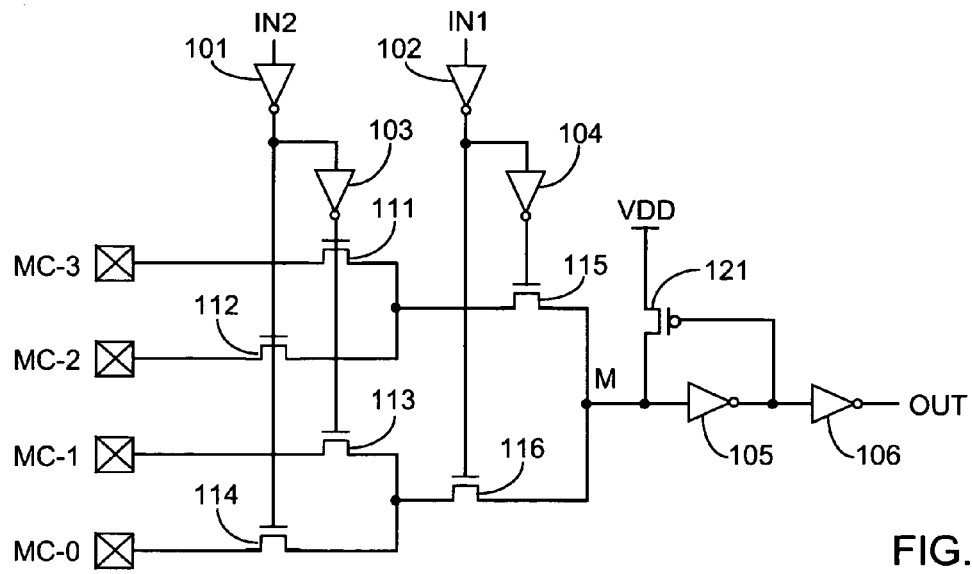
FIG. 1 shows a well-known lookup table (LUT) circuit.

The LUT circuit of FIG. 3 has two input signals IN1 and IN2, and can provide at the output terminal OUT any of four values stored in memory cells MC-0 through MC-3. The illustrated circuit includes four logical NAND gates 301–304, two inverters 105–106, six N-channel transistors 111–116, and a pullup 121 implemented (in the pictured embodiment) using a P-channel transistor. Elements 105–106, 111–116, 121, and MC-0 through MC-3 can be implemented and interconnected, for example, as in the known LUT circuit of FIG. 1. Therefore, these elements are not again described herein. Memory cells MC-A and MC-B can be, for example, configuration memory cells in an FPGA. In other embodiments, memory cells MC-A and MC-B are other storage elements such as flip-flops. In yet other embodiments, memory cells MC-A and MC-B are not included in the circuit, and the signals provided by these memory cells in the illustrated embodiments are instead provided by source(s) external to the LUT circuit.

The multiplexer circuit comprising N-channel transistors 111–116 is controlled in FIG. 3 by four select signals, each select signal being provided by a different one of logical NAND gates 301–304. Each logical NAND gate has one input terminal coupled to one of memory cells MC-A and MC-B. Logical NAND gate 301 is driven by input signal IN2 and memory cell MC-A. Logical NAND gate 302 is driven by input signal IN1 and memory cell MC-B. Logical NAND gate 303 is driven by logical NAND date 301 and memory cell MC-A. Finally, logical NAND gate 304 is driven by logical NAND gate 302 and memory cell MC-B.

(The term "logical NAND gate" is used herein to designate a logical circuit performing a NAND function. The most common form of a logical NAND circuit is, of course, a NAND gate. However, as is known to those of skill in the art, a logical NAND circuit can also be implemented in other ways, e.g., as an OR gate with inverted inputs. Similarly, the term "inverting logic gate" can refer to an inverter, but can also refer to another circuit that provides an inverting function, e.g., a two-input logic gate having an enable input as a second input.)

Figure 4A:
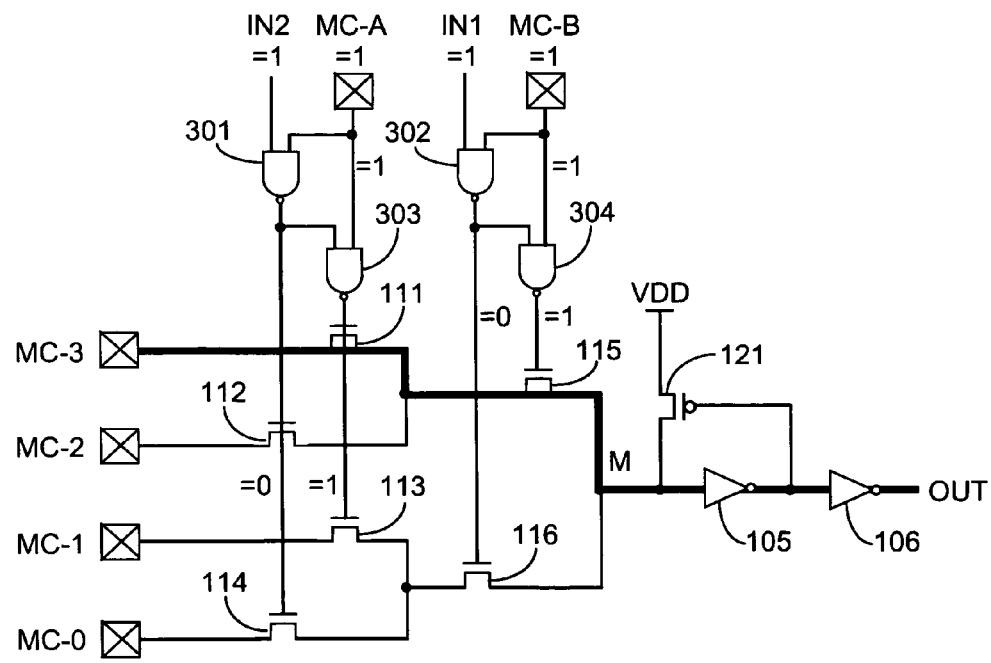
FIGS. 4A–4C provide examples of the functionality of the LUT circuit of FIG. 3.
Figure 4B:
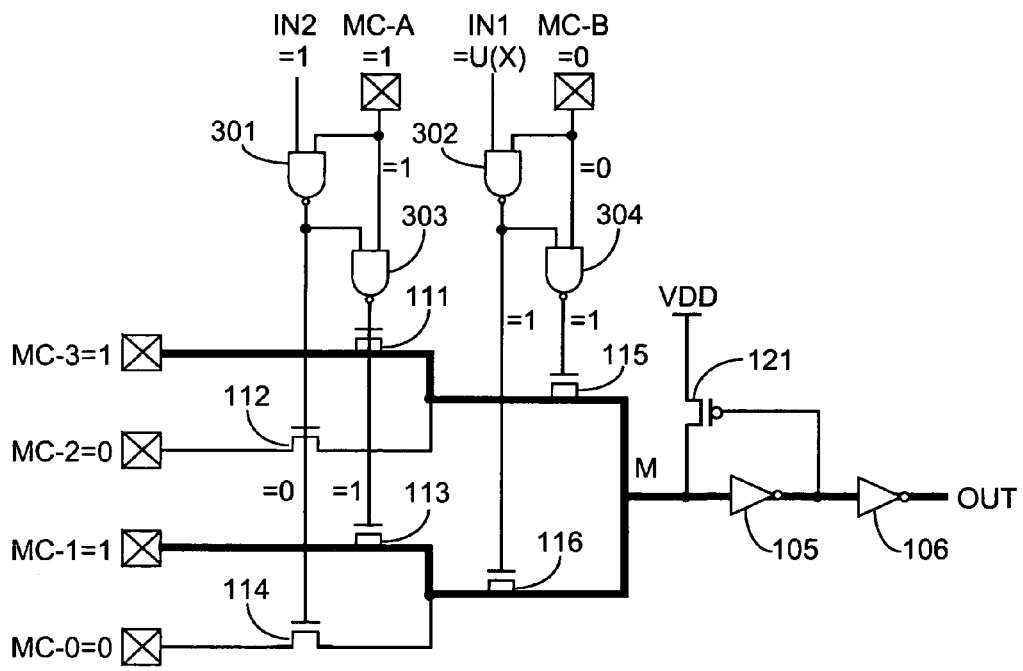
Figure 4C:
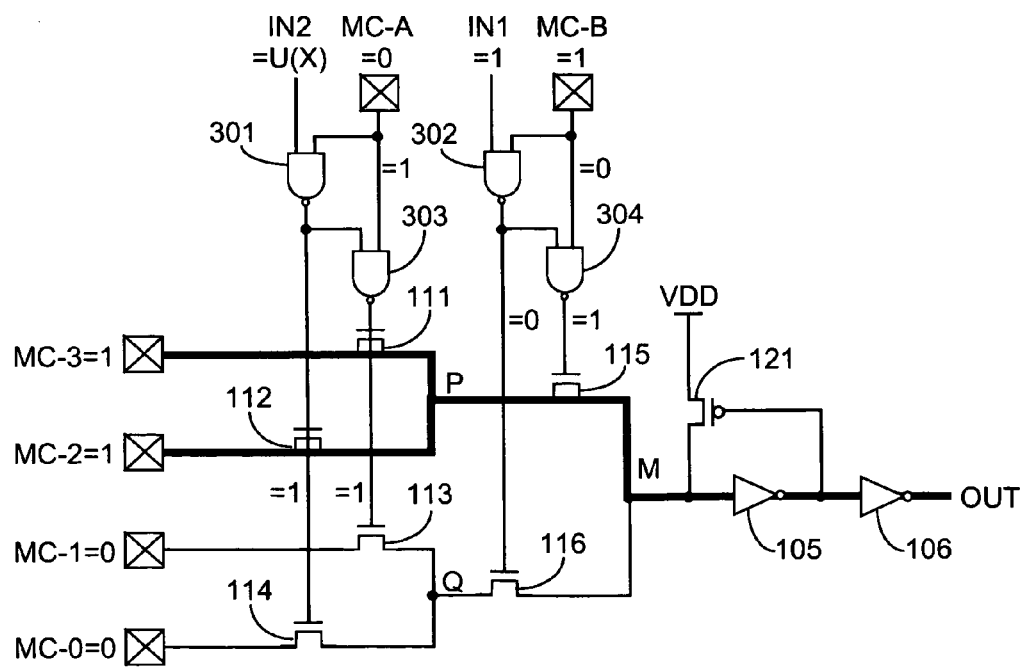

The LUT circuit of FIG. 3 functions, for example, as shown in FIGS. 4A–4C.

Figure 2:
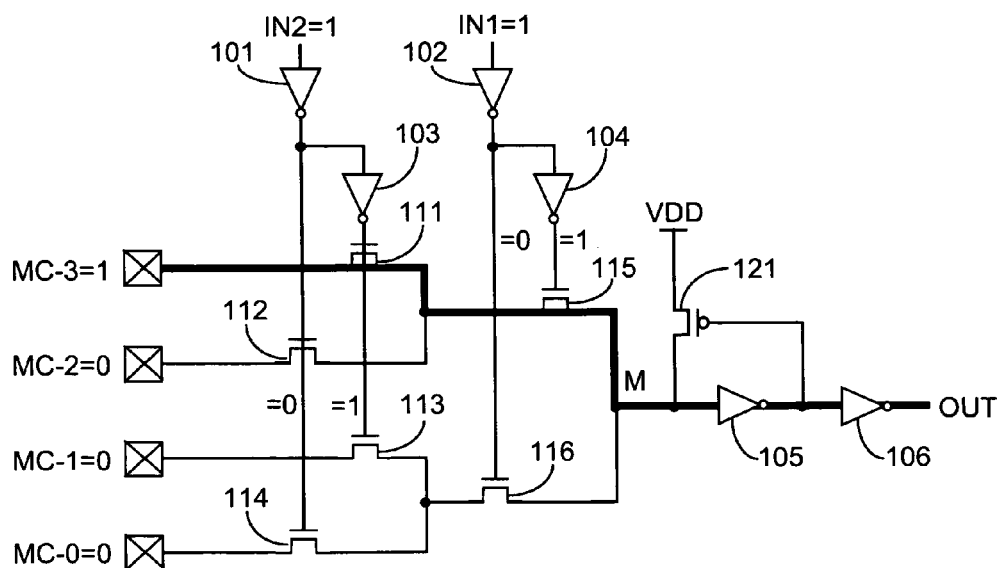
FIG. 2 provides an example of the functionality of the LUT circuit of FIG. 1.

In the example illustrated in FIG. 4A, a high value is stored in both of memory cells MC-A and MC-B. In this example, clearly the circuit becomes logically equivalent to the circuit shown in FIG. 1. Therefore, signals IN1 and IN2 are both used to select one of the four values stored in memory cells MC-0 through MC-3. A heavy line in FIG. 4A shows the signal path enabled between memory cell MC-3 and output terminal OUT. In this example, the LUT circuit functions in the same manner as that shown in FIG. 2.

In the example illustrated in FIG. 4B, input signal IN2 is high, input signal IN1 has an unknown value (X, or a "don't care" value), memory cell MC-A stores a high value, and memory cell MC-B stores a low value. In the pictured example, memory cells MC-0 and MC-2 store low values, and memory cells MC-1 and MC-3 store high values. However, in another embodiment (not shown) memory cells MC-0 and MC-2 store high values, and memory cells MC-1 and MC-3 store low values. In the exemplary scenario of FIG. 4B, logical NAND gate 301 provides a low value, because signal IN2 is high and memory cell MC-A stores a high value. Logical NAND gate 303 provides a high value, because of the low value provided by logical NAND gate 301. Thus, the first stage of the multiplexer circuit (N-channel transistors 111–114) serves to select two of the four stored values, based on the value of input signal IN2.

The second stage of the multiplexer circuit (N-channel transistors 115–116) is controlled by logical NAND gates 302 and 304. Each of gates 302 and 304 provides a high value, irregardless of the value of input signal IN1, because of the low value stored in memory cell MC-B. Thus, both paths through the second stage are enabled, and the stored values from both of memory cells MC-3 and MC-1 are passed to node M, and hence to output terminal OUT of the LUT circuit. Heavy lines in FIG. 4B show the two signal paths now enabled between memory cell MC-3 and output terminal OUT, and between memory cell MC-1 and output terminal OUT. Because two "copies" of the stored value are provided to node M, node M assumes the stored value more rapidly than in the example of FIG. 4A. The effective resistance through the multiplexer is reduced. Thus, the delay through the LUT circuit is reduced.

Clearly, when two stored values are provided to the same node (node M), the two stored values must have the same logical value. In other words, both values must be high, or both values must be low. In the embodiment of FIGS. 3 and 4A–4C, memory cells MC-0 through MC-3 are configuration memory cells of an FPGA. Thus, in the embodiment of FIG. 4B, memory cells MC-3 and MC-1 are configured with the same logical value, and memory cells MC-2 and MC-0 are configured with the same logical value. Either of the two logical values can be selected, depending on the value of input signal IN2.

In the example illustrated in FIG. 4C, input signal IN1 is high, input signal IN2 has an unknown value, memory cell MC-A stores a low value, and memory cell MC-B stores a high value. In the pictured example, memory cells MC-0 and MC-1 store low values, and memory cells MC-2 and MC-3 store high values. However, in another embodiment (not shown) memory cells MC-0 and MC-1 store high values, and memory cells MC-2 and MC-3 store low values.

In the exemplary scenario of FIG. 4C, each of NAND gates 301 and 303 provides a high value, irregardless of the value of input signal IN2, because of the low value stored in memory cell MC-A. Thus, all four of the stored values are passed through to the second stage of the multiplexer circuit, with two stored values (from memory cells MC-2 and MC-3) being provided to node P and two stored values (from memory cells MC-0 and MC-1) being provided to node Q. Because two "copies" of the stored values are provided to each of nodes P and Q, the effective resistance between the memory cells and node M is lower than in the example of FIG. 4A. Thus, the delay through the LUT circuit is reduced.

In the second stage of the multiplexer circuit (N-channel transistors 115–116), logical NAND gate 302 provides a low value, because signal IN1 is high and memory cell MC-B stores a high value. Logical NAND gate 304 provides a high value, because of the low value provided by logical NAND gate 302. Thus, the second stage of the multiplexer circuit selects one signal that represents two of the four stored values, based on the value of input signal IN1. Heavy lines in FIG. 4C show the two signal paths now enabled between memory cell MC-3 and output terminal OUT, and between memory cell MC-2 and output terminal OUT.

As previously noted in connection with FIG. 4B, when two stored values are provided to the same node (node M), the two stored values must have the same logical value. In other words, both values must be high, or both values must be low. In the embodiment of FIGS. 3 and 4A–4C, memory cells MC-0 through MC-3 are configuration memory cells of an FPGA. Thus, in the embodiment of FIG. 4C, memory cells MC-3 and MC-2 are configured with the same logical value, and memory cells MC-1 and MC-0 are configured with the same logical value. Either of the two logical values can be selected, depending on the value of input signal IN1.

Clearly, the assignment of logical values to memory cells MC-0 through MC-3 is dependent on which signal paths through the multiplexer circuit can be enabled at the same time, which in turn depends on the values stored in memory cells MC-A and MC-B. This principle also holds true when the examples of FIGS. 3 and 4A–4C are extended to larger multiplexer circuits having larger numbers of memory cells and larger numbers of signal paths.

In some embodiments, in which the LUT circuit forms a portion of a PLD, input terminal IN1 is coupled to a first signal line, and input terminal IN2 is coupled to a second signal line. When both signal lines are in use (i.e., included in a user design programmed into the PLD), as shown in FIG. 4A, the PLD is configured to store a high value in each of memory cells MC-A and MC-B. Because two signal lines are in use (i.e., two select signals are provided), four stored values are provided and each stored value can have any logical value. When only the second signal line is in use (i.e., the signal line coupled to terminal IN2), as shown in FIG. 4B, the PLD is configured to store a high value in memory cell MC-A and a low value in memory cell MC-B, and two stored values are provided to node M. When only the first signal line is in use (i.e., the signal line coupled to terminal IN1), as shown in FIG. 4C, the PLD is configured to store a low value in memory cell MC-A and a high value in memory cell MC-B, and two stored values are provided to node M.

Clearly, including the LUT circuit of FIG. 3 in a PLD can provide shorter LUT delays when some LUT input terminals remain unused (i.e., not utilized in a user design implemented in the PLD). It is common for many LUT input terminals to remain unused, particularly when the LUTs have four input terminals or even larger numbers of input terminals (e.g., six or eight). Therefore, the LUT circuit of FIG. 3 (and the other exemplary LUT circuits shown and/or described herein) could significantly reduce circuit delays in PLDs.

As previously noted with regard to FIGS. 4B and 4C, an unused LUT input terminal can have a "don't-care" value. In other words, when an appropriate value is stored in the memory cell associated with the input terminal, any signal value on the input terminal is ignored. (Note that while a low value in the memory cell causes the input signal value to be ignored in the pictured embodiments, a high value can have the same function in other embodiments.) However, in some PLDs unused signal lines have a known value, and this characteristic can be used to simplify the LUT circuit.

Figure 5:
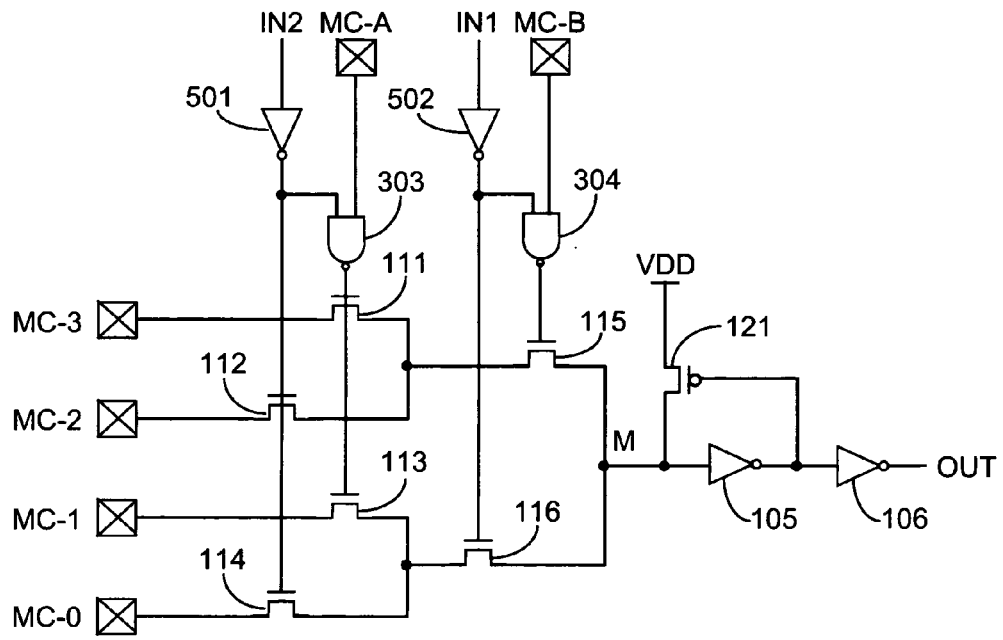
FIG. 5 shows a second 2-input LUT circuit according to an embodiment of the present invention.

FIG. 5 illustrates a LUT circuit according to an embodiment of the invention in which unused signal lines have a low value. The circuit of FIG. 5 is similar to that of FIG. 3, except that logical NAND gates 301 and 302 are replaced by inverting logic gates (e.g., inverters) 501 and 502, which are driven by input signals IN2 and IN1, respectively. Because unused signal lines always have a low value in this embodiment, the LUT circuit of FIG. 5 provides the same logical functionality as the circuit of FIG. 3.

When both input terminals are coupled to used interconnect lines, high values are programmed into both of memory cells MC-A and MC-B. Thus, logical NAND gates 303 and 304 are equivalent to inverters 103 and 104 of FIG. 1, and the LUT circuit functions in the same fashion as the circuit of FIG. 1.

Figure 6:
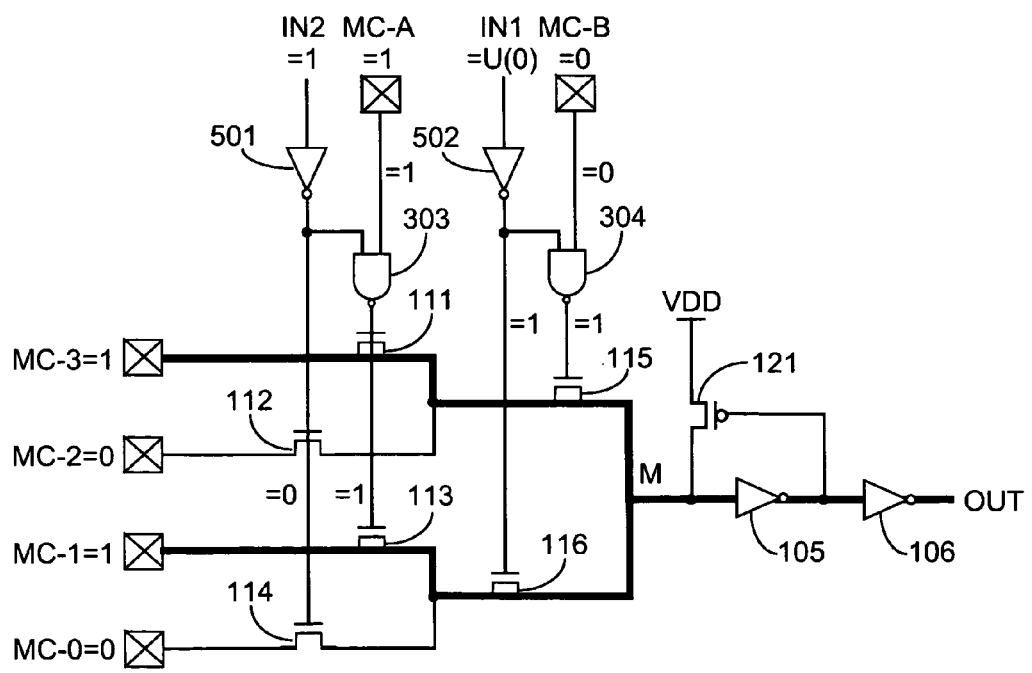
FIG. 6 provides an example of the functionality of the LUT circuit of FIG. 5.

When only one of the input terminals is coupled to a used signal line, a low value is programmed into the memory cell associated with the unused input terminal. For example, FIG. 6 illustrates the scenario when a first signal line coupled to input terminal IN1 is unused, and a second signal line coupled to input terminal IN2 is used. In the pictured embodiment, a high value is provided on signal line IN2. Thus, inverting logic gate 501 provides a low signal and logical NAND gate 303 provides a high signal, as in FIG. 4. Signal line IN1 provides a low signal, because the signal line is unused (U). Thus, inverting logic gate 502 and logical NAND gate 304 each provide a high signal, selecting both paths through the second stage of the multiplexer circuit, as in the embodiment of FIG. 4. Thus, the circuit of FIG. 5 behaves in the same fashion as described in connection with FIG. 3, as long as an unused signal line always has a low value.

Figure 7:
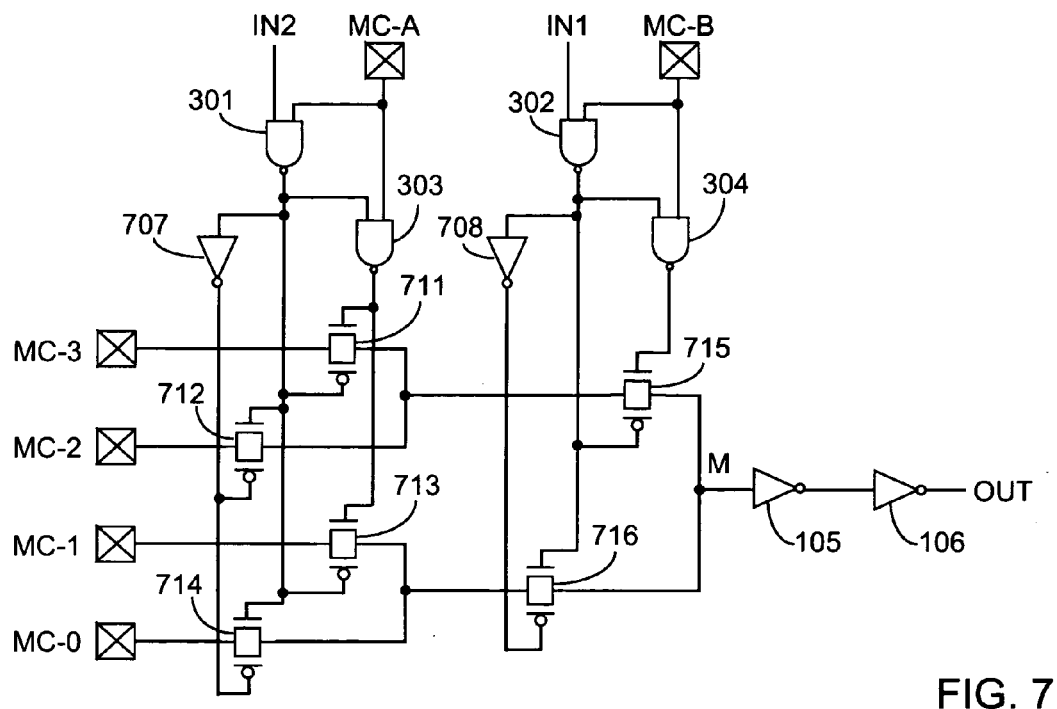
FIG. 7 shows a third 2-input LUT circuit according to an embodiment of the present invention.

FIG. 7 shows another modification of the circuit of FIG. 3, in which N-channel transistors 111–116 are replaced by CMOS passgates 711–716. The N-channel gate terminals of the CMOS passgates are coupled in the same fashion as the gate terminals of the corresponding N-channel transistors in FIG. 3. The output signal from logical NAND gate 301 is inverted by inverting logic gate (e.g., inverter) 707 and provided to the P-channel gate terminals of CMOS passgates 712 and 714. Similarly, the output signal from logical NAND gate 302 is inverted by inverting logic gate (e.g., inverter) 708 and provided to the P-channel gate terminal of CMOS passgate 716.

Figure 8:
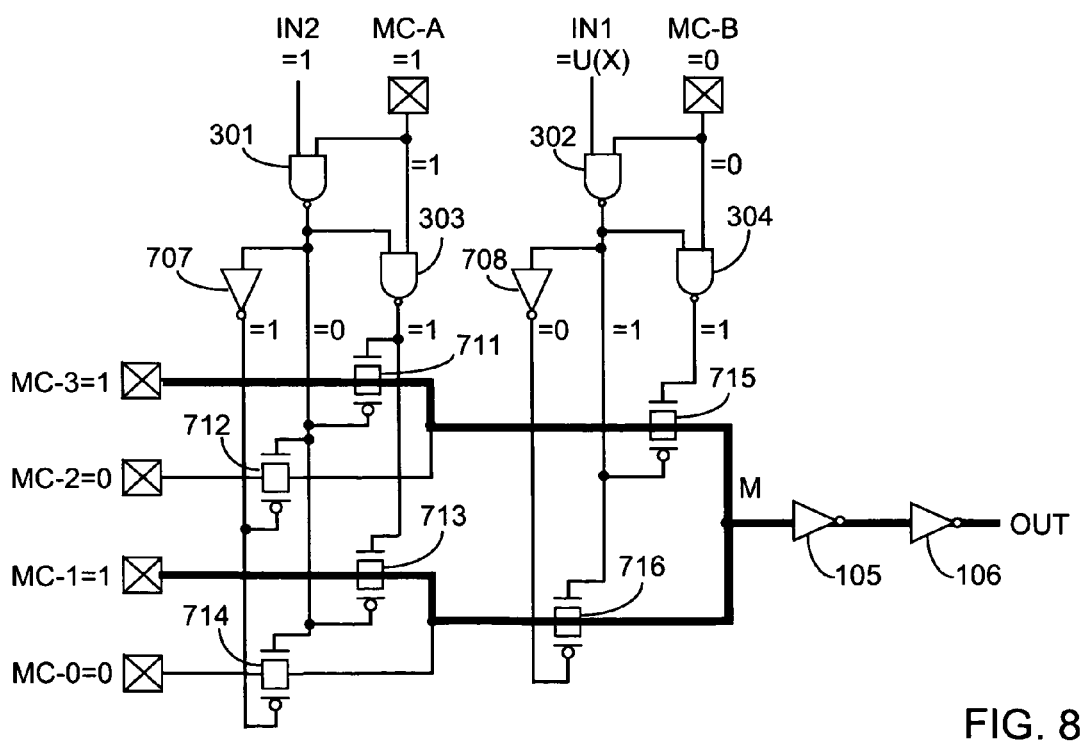
FIG. 8 provides an example of the functionality of the LUT circuit of FIG. 7.

In one embodiment (not shown), the output signals from logical NAND gates 303 and 304 are similarly inverted and provided to the P-channel gate terminals of CMOS passgates 711 and 713, and 715, respectively. However, in the illustrated embodiment the LUT circuit is simplified by providing the output signals from logical NAND gates 301 and 302 to the P-channel gate terminals of CMOS passgates 711 and 713, and 715, respectively. The two embodiments are not completely equivalent, because at times one of the P-channel gates can be turned off while the corresponding N-channel gate is turned on (e.g., see passgate 715 in FIG. 8). However, this situation only occurs when two signal paths are enabled through the multiplexer circuit, so the P-channel transistor in the other of the two enabled paths performs the function of pulling node M fully to power high VDD. Thus, pullup 121 is not needed in this circuit. In other respects, the circuit of FIG. 7 has the same functionality as the circuit of FIG. 3, e.g., as can be seen by comparing the examples shown in FIGS. 8 and 4.

Figure 9:
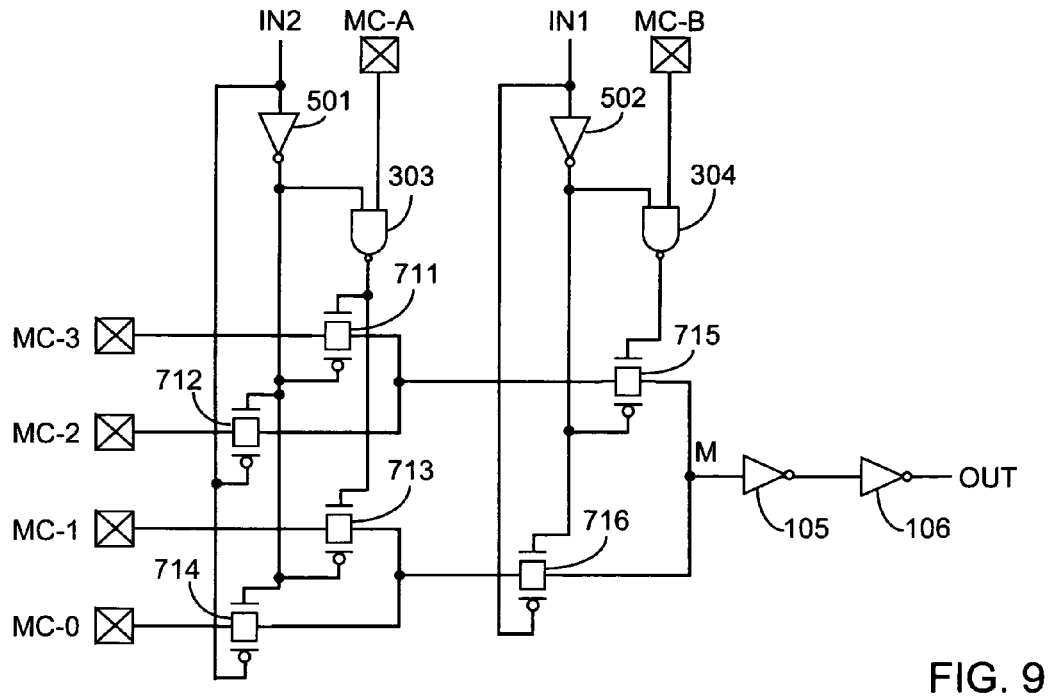
FIG. 9 shows a fourth 2-input LUT circuit according to an embodiment of the present invention.

FIG. 9 shows another embodiment of the invention, in which the LUT circuit of FIG. 5 is modified in a fashion similar to the way in which FIG. 7 was modified from FIG. 3. N-channel transistors 111–116 are replaced by CMOS pass-gates 711–716, as in FIG. 7. The N-channel gate terminals of the CMOS passgates are coupled in the same fashion as the gate terminals of the corresponding N-channel transistors in FIG. 5. Input signals IN2 and IN1 are provided to the P-channel gate terminals of CMOS passgates 712 and 714, and 716, respectively.

Figure 10:
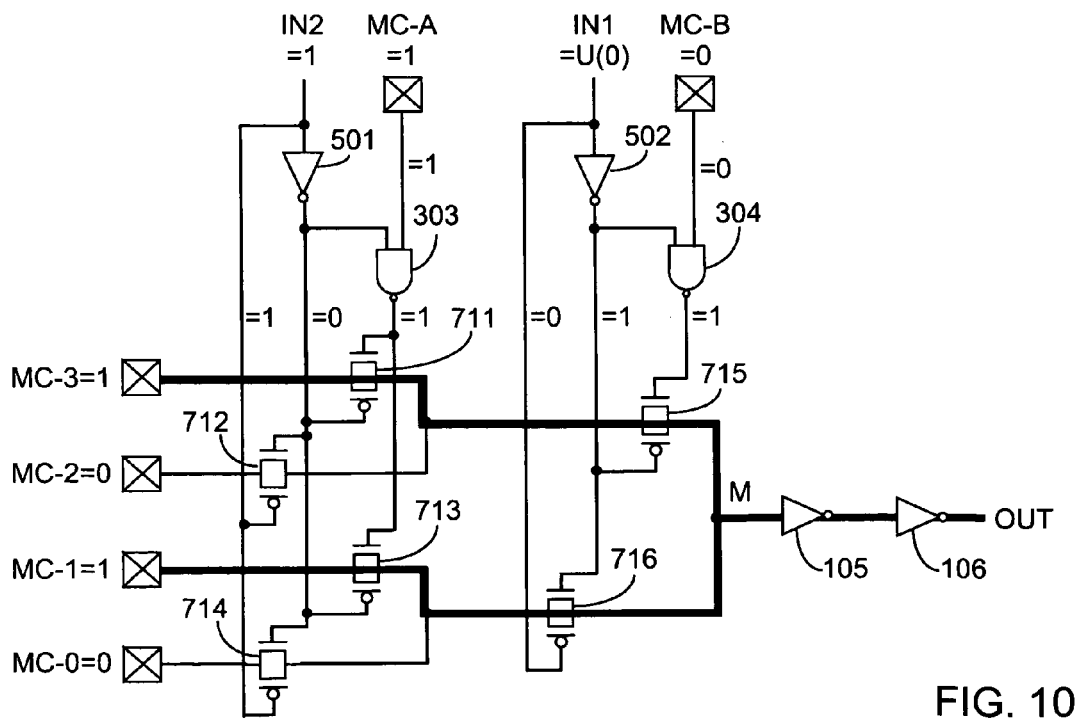
FIG. 10 provides an example of the functionality of the LUT circuit of FIG. 9.

In one embodiment (not shown), the output signals from logical NAND gates 303 and 304 are inverted and provided to the P-channel gate terminals of CMOS passgates 711 and 713, and 715, respectively. However, in the illustrated embodiment the LUT circuit is simplified by providing the output signals from inverting logic gates 501 and 502 to the P-channel gate terminals of CMOS passgates 711 and 713, and 715, respectively. Again, the two embodiments are not completely equivalent, because at times one of the P-channel gates can be turned off while the corresponding N-channel gate is turned on (e.g., see passgate 715 in FIG. 10). However, as in the embodiment of FIG. 7, in this situation two signal paths are enabled through the multiplexer circuit, so the P-channel transistor in the other of the two enabled paths performs the function of pulling node M fully to power high VDD. Thus, pullup 121 is not needed in this circuit. In other respects, the circuit of FIG. 9 has the same functionality as the circuit of FIG. 5, e.g., as can be seen by comparing the examples shown in FIGS. 10 and 7.

Several embodiments have been shown that constitute variations on the basic LUT circuit shown in FIG. 3. Clearly, many more variations are possible. For example, active-high signals can be replaced with active-low signals by making straightforward alterations to the circuitry, such as are well known in the art of circuit design. Logical circuits can be replaced by their logical equivalents by appropriately inverting input and output signals, as is also well known. The number of stored values and input (select) signals can be increased or decreased, along with the number of multiplexer stages. Multiplexer implementations other than the simple illustrated examples can be used. For example, the N-channel transistors and CMOS pass-gates illustrated in the examples herein can be replaced by other logic elements coupled to the select terminals of the multiplexer. It will be apparent to one skilled in the art after reading this specification that the present invention can be practiced within these and other architectural variations.

Figure 11:
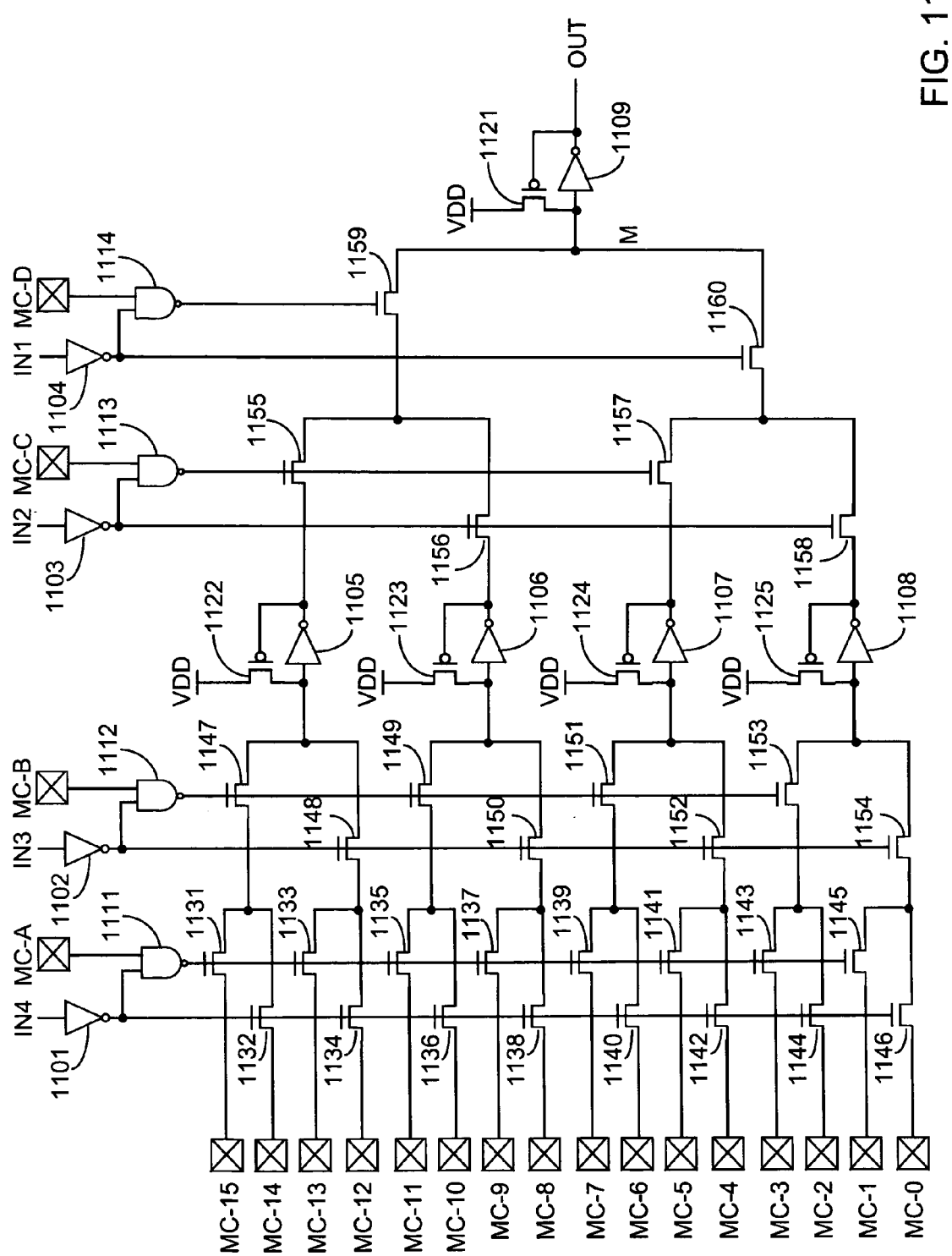
FIG. 11 shows a first 4-input LUT circuit according to an embodiment of the present invention.

FIG. 11 illustrates an exemplary LUT circuit having four input signals IN1–IN4, and providing at the output terminal OUT any of sixteen values stored in memory cells MC-0 through MC-15. The LUT circuit includes nine inverting logic gates (e.g., inverters) 1101–1109, four logical NAND gates 1111–1114, twenty memory cells MC-0 through MC-15 and MC-A through MC-D, thirty N-channel transistors 1131–1160, and pullups 1121–1125 implemented (in the pictured embodiment) using P-channel transistors. N-channel transistors 1131–1160 implement a well-known 16-to-1 multiplexer circuit, the output of which (node M) drives inverting logic gate 1109 and is pulled to power high (VDD) by P-channel transistor 1121. The output terminal of inverting logic gate 1109 is coupled to the gate terminal of pullup 1121 and also provides the output signal OUT to the output terminal. Pullup 1121 serves to pull node M fully to power high VDD when a memory cell storing a high value is selected by transistors 1131–1160. Inverting logic gates 1105–1108 and pullups 1122–1125 perform a similar function halfway through each signal path traversing the multiplexer circuit.

The LUT circuit of FIG. 11 functions in a fashion similar to that described in conjunction with FIG. 5, except for an increased number of stages with the multiplexer. Note also that the number of enabled signal paths through the multiplexer circuit in the pictured embodiment can be as high as eight, depending on the number of unused input terminals. For example, suppose that input terminals IN1–IN3 are all unused. Input signal IN1 enables two paths, input signal IN2 increases the number of enabled paths to four, and input signal IN3 increases the number of enabled paths to eight. Such a reduction could significantly reduce the delay through the multiplexer circuit. As noted above, the same logical value must be stored at all locations from which signal paths are simultaneously enabled to the output terminal of the multiplexer circuit.

Clearly, the circuit of FIG. 11 can be easily extended yet further to accommodate even larger numbers of input signals and stored values, by adding additional stages to the multiplexer circuit. For example, one embodiment of the invention has six input signals and enables one, two, four, eight, sixteen, or thirty-two of sixty-four different signal paths through the multiplexer circuit.

Figure 12:
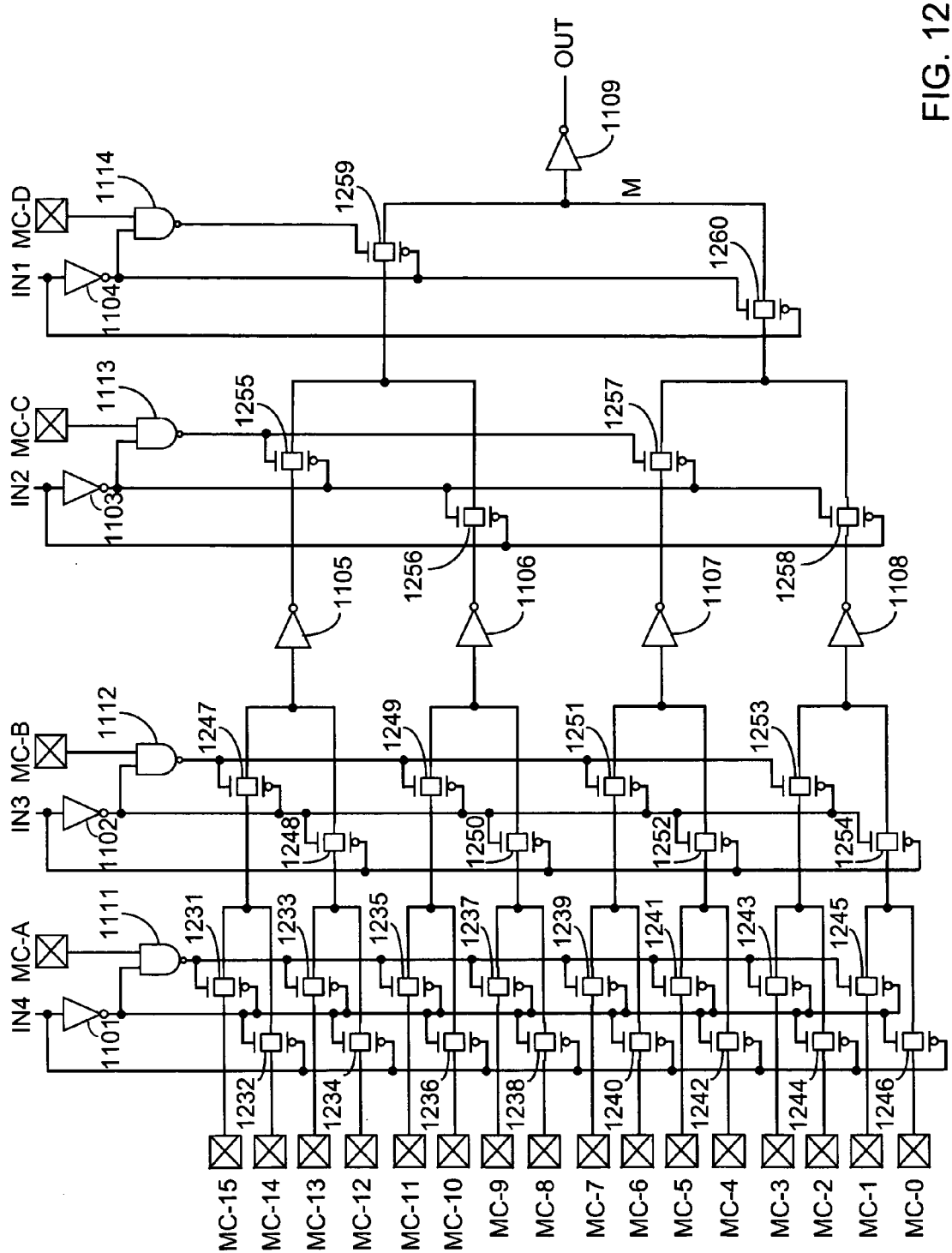
FIG. 12 shows a second 4-input LUT circuit according to an embodiment of the present invention.

FIG. 12 illustrates an embodiment in which the LUT circuit of FIG. 11 is modified in a fashion similar to the way in which FIG. 9 was modified from FIG. 5. N-channel transistors 1131–1160 are replaced by CMOS passgates 1231–1260. The N-channel gate terminals of the CMOS passgates are coupled in the same fashion as the gate terminals of the corresponding N-channel transistors in FIG. 11. Input signal IN4 is provided to the P-channel gate terminals of CMOS passgates 1232, 1234, 1236, 1238, 1240, 1242, 1244, and 1246. Input signal IN3 is provided to the P-channel gate terminals of CMOS passgates 1248, 1250, 1252, and 1254. Input signal IN2 is provided to the P-channel gate terminals of CMOS passgates 1256 and 1258. Input signal IN1 is provided to the P-channel gate terminal of CMOS passgate 1260.

In one embodiment (not shown), the output signal from logical NAND gate 1111 is inverted and provided to the P-channel gate terminals of CMOS passgates 1231, 1233, 1235, 1237, 1239, 1241, 1243, and 1245. Similarly, the output signal from logical NAND gate 1112 is inverted and provided to the P-channel gate terminals of CMOS passgates 1247, 1249, 1251, and 1253; the output signal from logical NAND gate 1113 is inverted and provided to the P-channel gate terminals of CMOS passgates 1255 and 1257; and the output signal from logical NAND gate 1114 is inverted and provided to the P-channel gate terminal of CMOS passgate 1259.

In the pictured embodiment the LUT circuit is simplified by providing the output signals from the existing inverting logic gates to the P-channel gate terminals of the CMOS passgates, in a fashion similar to that employed in the embodiment of FIG. 9. The two embodiments are not completely equivalent, because at times one of the P-channel gates can be turned off while the corresponding N-channel gate is turned on. However, as previously noted, as long as at least one path through the multiplexer circuit provides enabled P-channel gates along its full length, pullups 1121–1125 (see FIG. 11) are not needed in this circuit.

Figure 13:
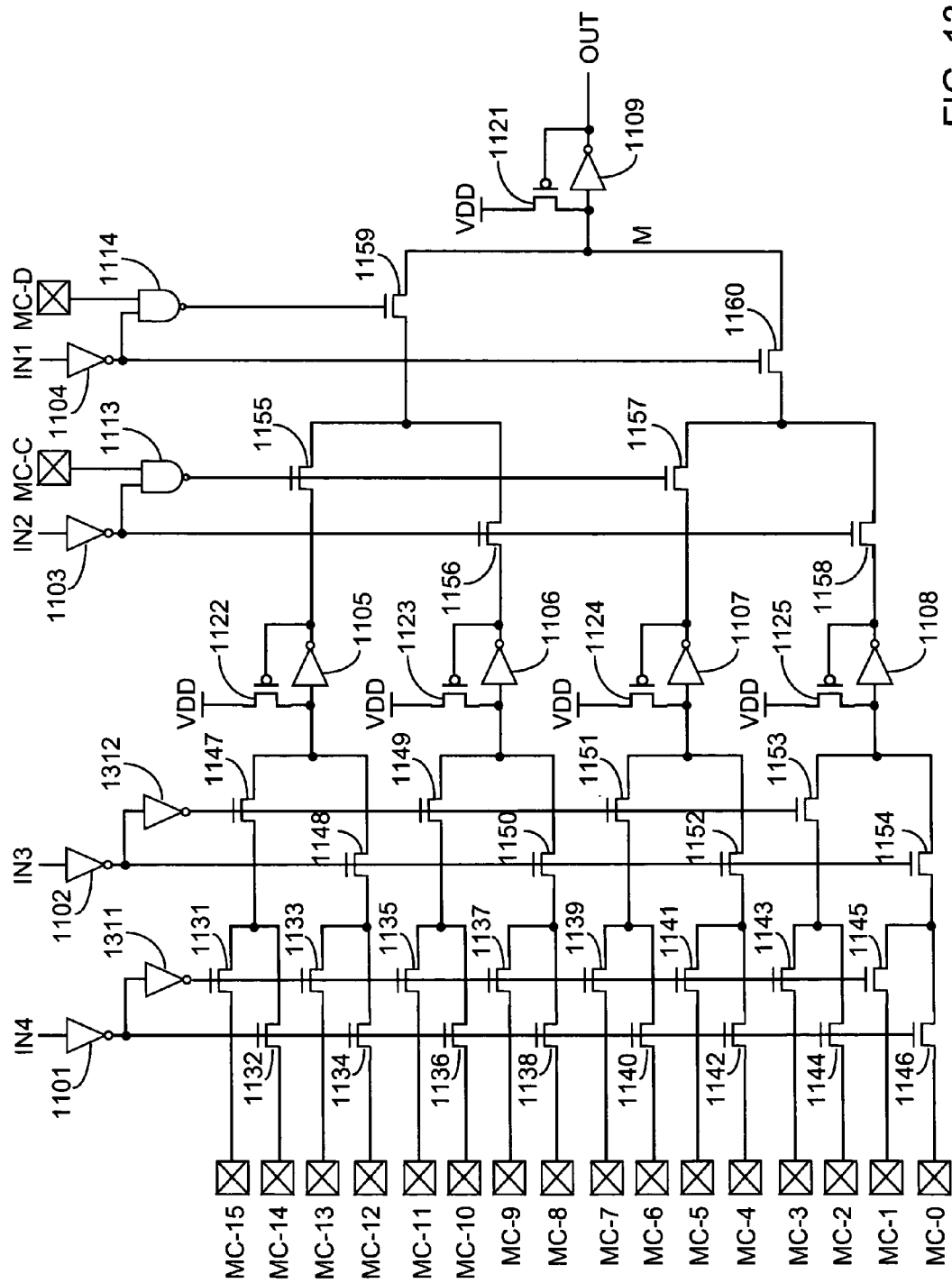
FIG. 13 shows a third 4-input LUT circuit according to an embodiment of the present invention.

FIG. 13 illustrates another variation on the circuit of FIG. 11. In this embodiment, the capabilities provided by the present invention are provided to some of the input terminals of the circuit, and not to other input terminals. Note that, comparing FIG. 13 to FIG. 11, memory cells MC-C and MC-D are included, while memory cells MC-A and MC-B are omitted. Logical NAND gates 1111 and 1112 are replaced by inverting logic gates (e.g., inverters) 1311 and 1312. This embodiment might be used, for example, if the heavy loading on logical NAND gates 1111 and 1112 (see FIG. 11) proves to slow down the circuit enough to counteract the speed benefits provided by the invention.

Figure 14:
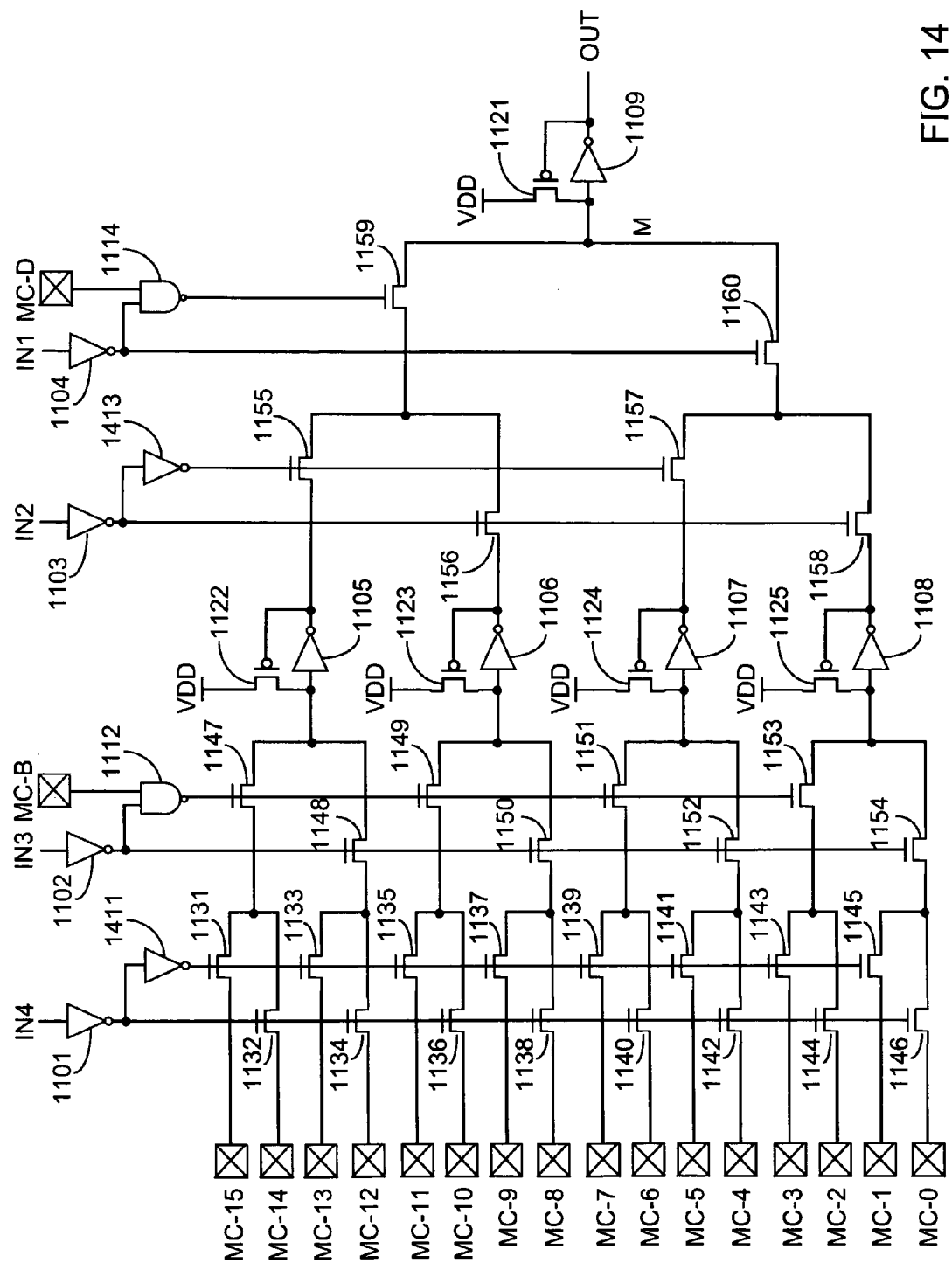
FIG. 14 shows a fourth 4-input LUT circuit according to an embodiment of the present invention.

FIG. 14 illustrates another variation on the circuit of FIG. 11, in which the capabilities of the invention are added to alternating input terminals of the circuit. Note that, comparing FIG. 14 to FIG. 11, memory cells MC-B and MC-D are included, while memory cells MC-A and MC-C are omitted. Logical NAND gates 1111 and 1113 are replaced by inverting logic gates (e.g., inverters) 1411 and 1413.

Figure 15:
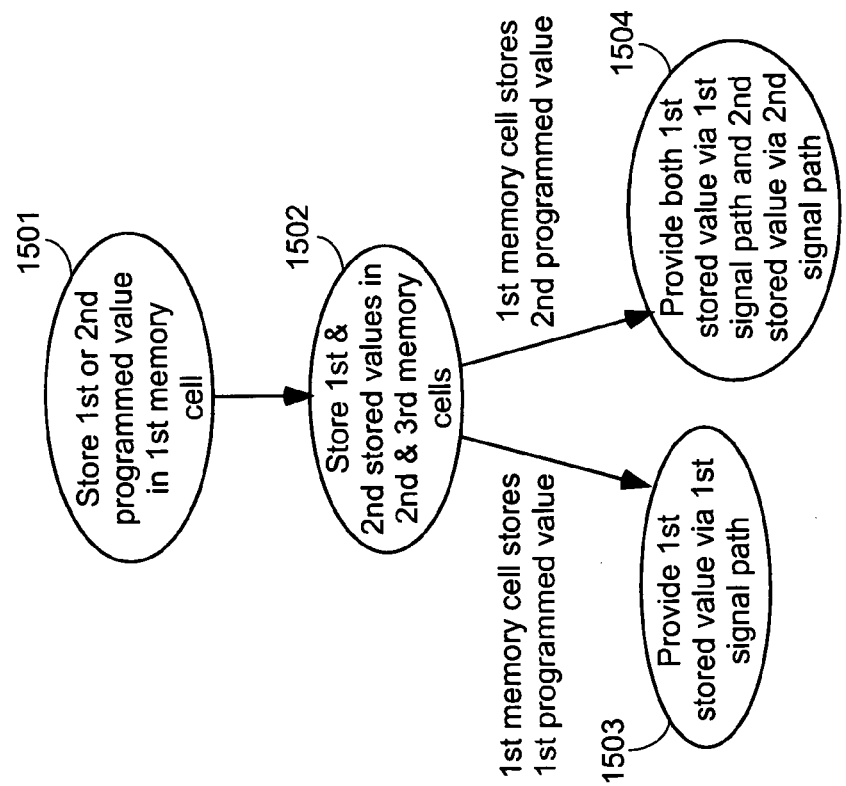
FIG. 15 illustrates the steps of a method of providing a logical value, according to an embodiment of the present invention.

FIG. 15 illustrates an exemplary method of providing a logical value, according to an embodiment of the present invention. In step 1501, one of two values (either a first or a second programmed value) is stored in a first memory cell. The first and second programmed values are different from each other. For example, in some embodiments the first programmed value is a high value and the second programmed value is a low value. In other embodiments, the first programmed value is a low value and the second programmed value is a high value. In step 1502, two values (a first and a second stored value) are stored in second and third memory cells.

In step 1503, when the first memory cell stores the first programmed value (e.g., a high value in the pictured embodiments), the first stored value is provided via a first signal path. In step 1504, when the first memory cell stores the second programmed value (e.g., a low value in the pictured embodiments), both the first and the second stored values are provided. The first stored value is provided via the first signal path, and the second stored value is provided via a second signal path.

Clearly, to avoid contention while providing both the first and the second stored values to the same node or output terminal, the first and second stored values should be the same. Also, the first and second signal paths are different for at least a portion of the two signal paths. However, other portions of the two signal paths can traverse the same signal lines and logical elements.

In some embodiments, the steps of the method are performed using a PLD, e.g., an FPGA. In these embodiments, the first memory cell and/or the second and third memory cells can be configuration memory cells of the PLD. Thus, steps 1501 and 1502 can comprise configuring the PLD to store the programmed and/or stored values in the memory cells.

Figure 16:
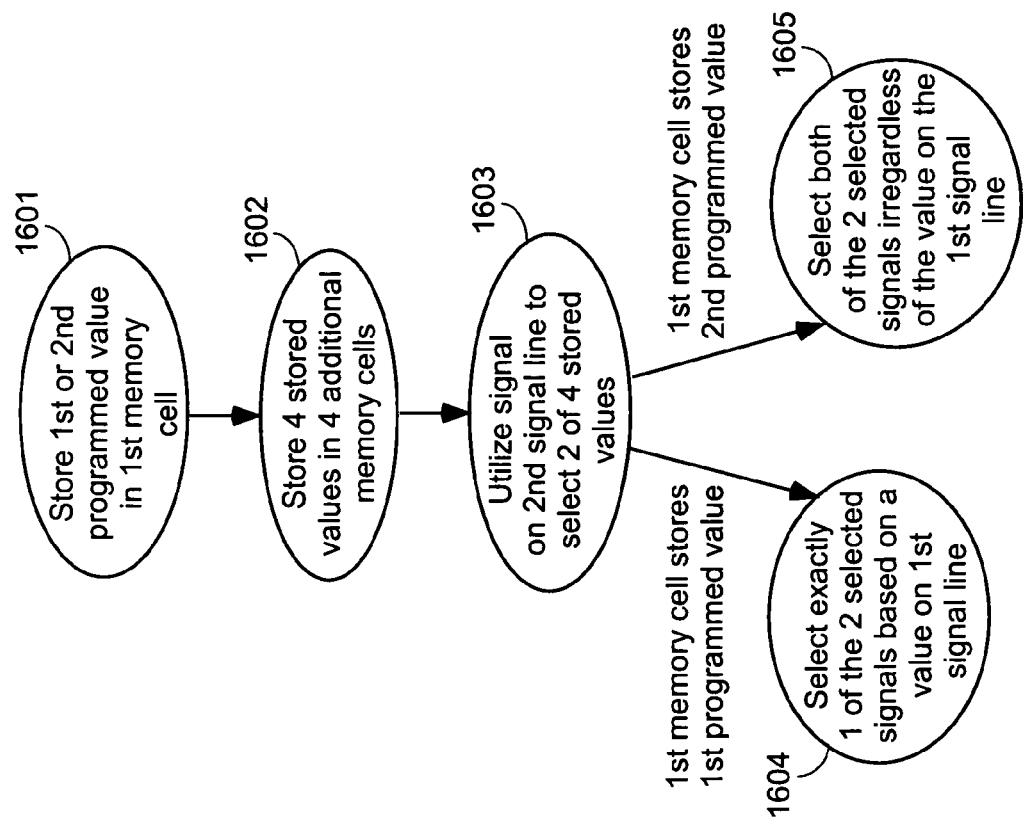
FIG. 16 illustrates the steps of a method of providing a logical value in a PLD, according to an embodiment of the present invention.

FIG. 16 illustrates the steps of a method of providing a logical value in a PLD, according to an embodiment of the present invention. The logical value is addressed by first and second signal lines (e.g., INx in the pictured embodiments). In step 1601, one of two different values (either a first or a second programmed value) is stored in a first memory cell. In some embodiments, the first programmed value is a high value and the second programmed value is a low value. In other embodiments, the first programmed value is a low value and the second programmed value is a high value. In step 1602, four values are stored in four additional memory cells.

In step 1603, a signal on the second signal line is utilized to select two signals comprising two of the four stored values. In step 1604, when the first memory cell stores the first programmed value (e.g., a high value in the pictured embodiments), exactly one of the two signals selected in step 1603 is selected. The selection is made based on a value stored on the first signal line. In step 1605, when the first memory cell stores the second programmed value (e.g., a low value in the pictured embodiments), both of the signals selected in step 1603 are selected irregardless of the value on the first signal line. To avoid contention on the node or output terminal to which the two signals are provided, both signals should have the same logical value when step 1605 applies.

In some embodiments, the first memory cell and/or the additional memory cells are configuration memory cells of the PLD. Thus, steps 1601 and 1602 can comprise configuring the PLD to store the programmed and/or stored values in the memory cells. In some embodiments, the PLD is an FPGA.

In some embodiments, step 1602 is omitted. Instead of storing the four stored values in four additional memory cells, the four stored values are provided by four multiplexer circuits, with the values being stored prior to being provided to the multiplexer circuits (e.g., see FIGS. 11–14). In some embodiments, some of the four stored values are provided by memory cells and at least one of the stored values is provided by a multiplexer circuit.

Figure 17:
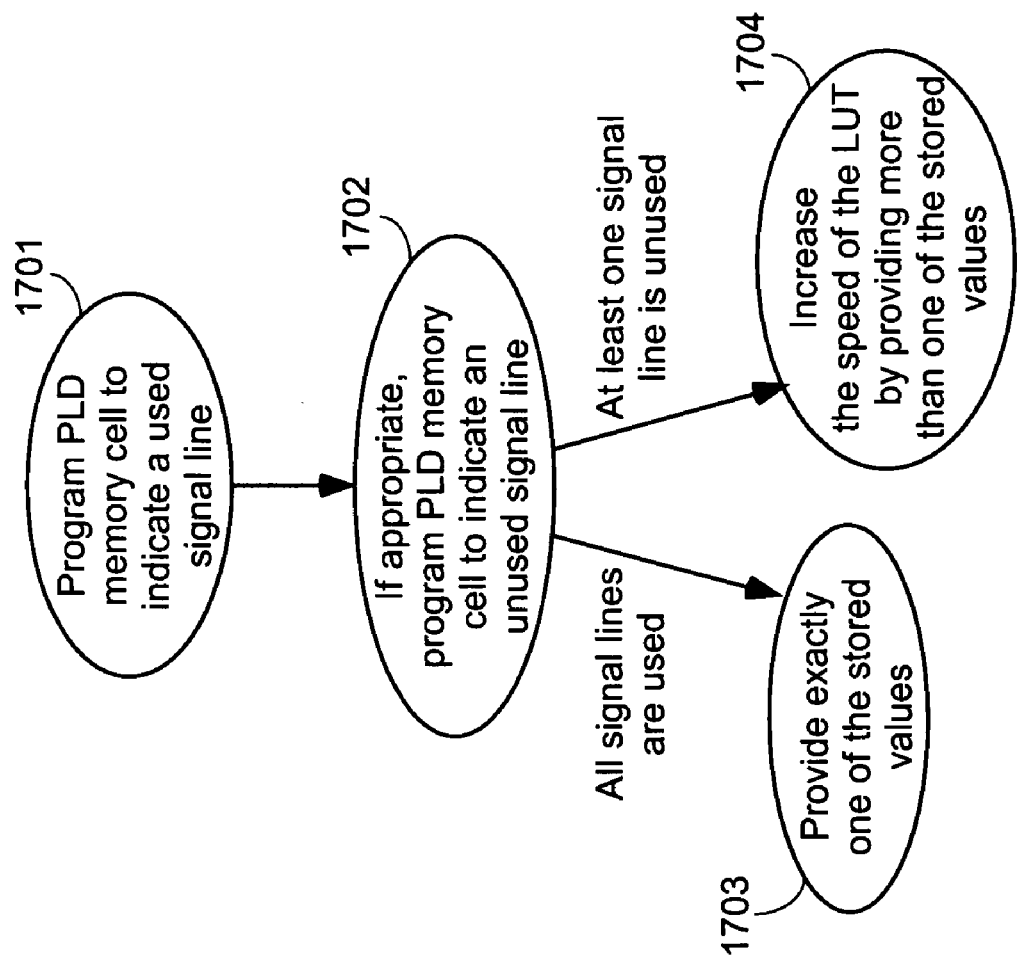
FIG. 17 illustrates the steps of a method of providing a logical value from a LUT, according to an embodiment of the present invention.

FIG. 17 illustrates the steps of a method of providing a logical value from a LUT, according to an embodiment of the present invention. The LUT includes a plurality of stored values and is controlled by a plurality of signal lines.

In step 1701, a PLD is configured with a PLD design. The PLD design can be, for example, an FPGA design. Configuring the PLD includes programming a configuration memory cell of the PLD with a first programmed value. The first programmed value indicates that one of the signal lines in the PLD design is used. In step 1702, another PLD memory cell is configured with a second programmed value. The second programmed value indicates that another one of the signal lines in the PLD design is unused. Clearly, step 1702 is only carried out when at least one of the signal lines in the PLD design is unused.

In step 1703, when all of the signal lines controlling the LUT are used in the PLD design, the LUT provides exactly one of the stored values. In step 1704, when at least one of the signal lines controlling the LUT is unused in the PLD design, the speed of the LUT is increased by providing more than one of the stored values. All of the more than one stored values have identical logical values.

In the exemplary LUT circuits and methods illustrated herein, the number of stored values is either four or sixteen, the number of signal lines is either two or four, and the number of stored values provided in step 1704 is two, four, or eight. For example, when there are sixteen stored values and four signal lines, one unused signal line results in two stored values being provided, two unused signal lines results in four stored values being provided, and three unused signal lines results in eight stored values being provided. However, the illustrated circuits are purely exemplary. LUTs having other numbers of stored values, signal lines, and provided values are easily extrapolated from the examples provided herein. For example, one LUT circuit according to the invention includes sixty-four stored values addressed by six signal lines, and can simultaneously provide (depending on the number of unused signal lines) either one, two, four, eight, sixteen, or thirty-two stored values.

Those having skill in the relevant arts of the invention will now perceive various modifications and additions that can be made as a result of the disclosure herein. For example, the above text describes the circuits of the invention in the context of programmable logic devices (PLDs) such as field programmable logic devices (FPGAs). However, the circuits of the invention can also be implemented in other programmable devices, circuits, and systems.

Further, pullups, transistors, P-channel transistors, N-channel transistors, multiplexers, multiplexer circuits, passgates, CMOS passgates, memory cells, configuration memory cells, inverting logic gates, inverters, logical NAND gates, NAND gates, buffers, output buffers, and other components other than those described herein can be used to implement the invention. Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A lookup table (LUT) circuit, comprising:
 a first LUT input terminal;
 a LUT output terminal;
 a multiplexer circuit having a plurality of data input terminals, a first select input terminal coupled to the first LUT input terminal, a second select input terminal, and an output terminal coupled to the LUT output terminal;
 a first memory cell; and
 a first logic gate having a first input terminal coupled to the first LUT input terminal, a second input terminal coupled to the first memory cell, and an output terminal coupled to the second select input terminal of the multiplexer circuit.

2. The lookup table circuit of claim 1, wherein the first logic gate is a logical NAND gate.

3. The lookup table circuit of claim 1, further comprising a second logic gate coupled between the first LUT input terminal and the first select input terminal of the multiplexer circuit, and further coupled between the first LUT input terminal and the first input terminal of the first logic gate, the second logic gate having an additional input terminal coupled to the first memory cell.

4. The lookup table circuit of claim 3, wherein the first and second logic gates comprise logical NAND gates.

5. The lookup table circuit of claim 1, wherein the lookup table circuit comprises a portion of a field programmable gate array (FPGA), and the first memory cell comprises a configuration memory cell of the FPGA.

6. The lookup table circuit of claim 1, further comprising a plurality of memory cells coupled to the data input terminals of the multiplexer circuit.

7. The lookup table circuit of claim 6, wherein the lookup table circuit comprises a portion of a field programmable gate array (FPGA), and the first memory cell and the plurality of memory cells all comprise configuration memory cells of the FPGA.

8. The lookup table circuit of claim 1, wherein the multiplexer circuit comprises a plurality of N-channel transistors, each of the N-channel transistors having a first data terminal coupled to a corresponding data input terminal of the multiplexer circuit, a second data terminal coupled to the output terminal of the multiplexer circuit, and a gate terminal coupled to a corresponding select input terminal of the multiplexer circuit.

9. The lookup table circuit of claim 8, wherein:
 the multiplexer circuit further comprises a third select input terminal;
 the lookup table circuit further comprises an inverting logic gate coupled between the first LUT input terminal and the third select input terminal of the multiplexer circuit; and
 the multiplexer circuit further comprises a plurality of P-channel transistors, each of the P-channel transistors having a first data terminal coupled to a corresponding data input terminal of the multiplexer circuit, a second data terminal coupled to the output terminal of the multiplexer circuit, and a gate terminal coupled to one of the first and third select terminals of the multiplexer circuit.

10. The lookup table circuit of claim 8, further comprising:
 a second logic gate coupled between the first LUT input terminal and the first select input terminal of the multiplexer circuit, and further coupled between the first LUT input terminal and the first input terminal of the first logic gate, the second logic gate having an additional input terminal coupled to the first memory cell; and
 an inverting logic gate having an input terminal coupled to the output terminal of the second logic gate and an output terminal coupled to a third select input terminal of the multiplexer circuit, and wherein:
 the multiplexer circuit further comprises a plurality of P-channel transistors, each of the P-channel transistors having a first data terminal coupled to a corresponding data input terminal of the multiplexer circuit, a second data terminal coupled to the output terminal of the multiplexer circuit, and a gate terminal coupled to one of the first and third select terminals of the multiplexer circuit.

11. The lookup table circuit of claim 1, wherein the multiplexer circuit further comprises third and fourth select input terminals, the lookup table circuit further comprising:
a second LUT input terminal coupled to the third select input terminal of the multiplexer circuit; and
an inverting logic gate coupled between the third and fourth select input terminals of the multiplexer circuit.

12. The lookup table circuit of claim 1, further comprising an output buffer coupled between the output terminal of the multiplexer circuit and the LUT output terminal.

13. The lookup table circuit of claim 12, wherein the output buffer comprises a pullup coupled to the output terminal of the multiplexer circuit.

14. A programmable lookup table (LUT) circuit, comprising:
a multiplexer circuit comprising a plurality of data input terminals, a plurality of select terminals, and an output terminal, the multiplexer circuit further comprising a programmable path therethrough from each input terminal to the output terminal, each programmable path traversing at least one logic element coupled to one of the select terminals; and
programmable means, coupled to the select terminals of the multiplexer circuit, for enabling exactly one of the programmable paths in response to a first programmed value and enabling a plurality of the programmable paths in response to a second programmed value.

15. The programmable LUT circuit of claim 14, wherein each logic element comprises an N-channel transistor having a gate terminal coupled to one of the select terminals.

16. The programmable LUT circuit of claim 14, wherein each logic element comprises a P-channel transistor and an associated N-channel transistor coupled in parallel, the P-channel transistor and the N-channel transistor each having a gate terminal coupled to one of the select terminals.

17. The programmable LUT circuit of claim 14, further comprising a plurality of memory cells coupled to the data input terminals of the multiplexer circuit.

18. The programmable LUT circuit of claim 17, wherein the programmable LUT circuit comprises a portion of a field programmable gate array (FPGA), and the plurality of memory cells comprise configuration memory cells of the FPGA.

19. The programmable LUT circuit of claim 14, further comprising an output buffer having an input terminal coupled to the output terminal of the multiplexer circuit.

20. The programmable LUT circuit of claim 19, wherein the output buffer comprises a pullup coupled to the output terminal of the multiplexer circuit.

21. The programmable LUT circuit of claim 14, wherein the first programmed value is a high value and the second programmed value is a low value.

22. The programmable LUT circuit of claim 14, wherein the programmable means comprises:
a first LUT input terminal;
a first memory cell; and
a first logic gate having a first input terminal coupled to the first LUT input terminal, a second input terminal coupled to the first memory cell, and an output terminal coupled to a first select input terminal of the multiplexer circuit.

23. The programmable LUT circuit of claim 22, wherein the first logic gate is a logical NAND gate.

24. The programmable LUT circuit of claim 22, further comprising a second logic gate coupled between the first LUT input terminal and a second select input terminal of the multiplexer circuit, and further coupled between the first LUT input terminal and the first logic gate, the second logic gate having an additional input terminal coupled to the first memory cell.

25. The programmable LUT circuit of claim 24, wherein the first and second logic gates comprise logical NAND gates.

26. The programmable LUT circuit of claim 22, wherein the programmable LUT circuit comprises a portion of a field programmable gate array (FPGA), and the first memory cell comprises a configuration memory cell of the FPGA.

27. The programmable LUT circuit of claim 22, wherein the programmable means further comprises:
a second LUT input terminal;
a second memory cell; and
a second logic gate having a first input terminal coupled to the second LUT input terminal, a second input terminal coupled to the second memory cell, and an output terminal coupled to a second select input terminal of the multiplexer circuit.

28. A method of providing a logical value, the method comprising:
providing, when a first memory cell stores a first programmed value, a first stored value via a first signal path; and
providing, when the first memory cell stores a second programmed value, both the first stored value via the first signal path and a second stored value via a second signal path,
wherein both the first stored value and the second stored value have the logical value,
wherein the first and second signal paths differ from each other in at least a portion of the signal paths, and
wherein the first and second programmed values differ from each other.

29. The method of claim 28, wherein the first memory cell comprises a configuration memory cell in a programmable logic device (PLD).

30. The method of claim 29, further comprising:
configuring the PLD to store one of the first and second programmed values in the first memory cell.

31. The method of claim 29, wherein the PLD is a field programmable gate array (FPGA).

32. The method of claim 28, further comprising:
storing one of the first and second programmed values in the first memory cell.

33. The method of claim 28, further comprising:
storing the first and second stored values in second and third memory cells.

34. The method of claim 33, wherein the second and third memory cells comprise configuration memory cells in a programmable logic device (PLD).

35. The method of claim 34, further comprising:
configuring the PLD to store the first and second stored values in the second and third memory cells, respectively.

36. The method of claim 34, wherein the PLD is a field programmable gate array (FPGA).

37. The method of claim 28, wherein the first programmed value is a high value, and the second programmed value is a low value.

38. A method of providing a logical value in a programmable logic device (PLD), the logical value being addressed by first and second signal lines, the method comprising:
utilizing a signal on the second signal line to select two of four signals comprising four stored values;
selecting, when a first memory cell stores a first programmed value, exactly one of the two selected signals based on a value on the first signal line, the exactly one signal having the logical value; and selecting, when the first memory cell stores a second programmed value different from the first programmed value, both of the two selected signals irregardless of the value on the first signal line, the two selected signals both having the logical value.

39. The method of claim 38, wherein the second signal line comprises a used signal line in the PLD, and the first signal line comprises an unused signal line in the PLD.

40. The method of claim 38, wherein the first memory cell comprises a configuration memory cell of the PLD.

41. The method of claim 40, further comprising:
configuring the PLD to store one of the first and second programmed values in the first memory cell.

42. The method of claim 38, wherein the PLD is a field programmable gate array (FPGA).

43. The method of claim 38, further comprising:
storing one of the first and second programmed values in the first memory cell.

44. The method of claim 38, wherein the four stored values are stored in four additional memory cells.

45. The method of claim 44, further comprising:
storing the four stored values in the four additional memory cells.

46. The method of claim 44, wherein the four additional memory cells comprise configuration memory cells in the PLD.

47. The method of claim 46, further comprising:
configuring the PLD to store the four stored values in the four additional memory cells.

48. The method of claim 38, wherein the four stored values are provided by four multiplexer circuits.

49. The method of claim 38, wherein at least one of the four stored values is provided by a multiplexer circuit.

50. The method of claim 38, wherein the first programmed value is a high value, and the second programmed value is a low value.

51. A programmable lookup table (LUT) circuit, comprising:
a memory cell;
means for providing, when the memory cell stores a first programmed value, a first stored value via a first signal path; and
means for providing, when the memory cell stores a second programmed value, both the first stored value via the first signal path and a second stored value via a second signal path,
wherein the first stored value and the second stored value comprise the same logical value,
wherein the first and second signal paths differ from each other in at least a portion of the signal paths, and
wherein the first and second programmed values differ from each other.

52. A programmable lookup table (LUT) circuit providing a logical value addressed by first and second signal lines, the LUT circuit comprising:
a memory cell;
means for utilizing a signal on the second signal line to select two of four signals comprising four stored values;

means for selecting, when the memory cell stores a first programmed value, exactly one of the two selected signals based on a value on the first signal line, the exactly one signal having the logical value; and means for selecting, when the memory cell stores a second programmed value, both of the two selected signals irregardless of the value on the first signal line, the two selected signals both having the logical value.

53. A method of providing a logical value from a lookup table (LUT) utilized in a PLD design, the LUT comprising a plurality of stored values and being controlled by a plurality of signal lines, the method comprising:
providing, when all of the signal lines controlling the LUT are used in the PLD design, exactly one of the stored values; and
increasing, when at least one of the signal lines controlling the LUT is unused in the PLD design, the speed of the LUT by providing more than one of the stored values,
wherein all of the provided more than one stored values have identical logical values.

54. The method of claim 53, wherein:
the plurality of stored values comprises four values;
the plurality of signal lines comprises two signal lines; and
the provided more than one of the stored values comprises two stored values.

55. The method of claim 53, wherein:
the plurality of stored values comprises sixteen values;
the plurality of signal lines comprises four signal lines; and
the provided more than one of the stored values comprises one of two, four, and eight stored values.

56. The method of claim 55, wherein:
exactly one of the four signal lines is unused; and
the provided more than one of the stored values comprises two stored values.

57. The method of claim 55, wherein:
exactly two of the four signal lines are unused; and
the provided more than one of the stored values comprises four stored values.

58. The method of claim 55, wherein:
exactly three of the four signal lines are unused; and
the provided more than one of the stored values comprises eight stored values.

59. The method of claim 53, further comprising:
configuring a PLD with the PLD design, including programming a configuration memory cell of the PLD with a first programmed value indicating that a first one of the signal lines in the PLD design is used.

60. The method of claim 53, further comprising:
configuring a PLD with the PLD design, including programming a configuration memory cell of the PLD with a second programmed value indicating that a second one of the signal lines in the PLD design is unused.

61. The method of claim 53, wherein the PLD design is a field programmable gate array (FPGA) design.

* * * * *